United States Patent
Balkus, Jr. et al.

(10) Patent No.: US 6,274,207 B1
(45) Date of Patent: Aug. 14, 2001

(54) METHOD OF COATING THREE DIMENSIONAL OBJECTS WITH MOLECULAR SIEVES

(75) Inventors: Kenneth J Balkus, Jr., The Colony; Mary E Kinsel, Arlington; Ashley S Scott, Richardson, all of TX (US)

(73) Assignee: The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/316,322

(22) Filed: May 21, 1999

(51) Int. Cl.⁷ ................................................. C23C 14/28
(52) U.S. Cl. .................... 427/596; 427/597; 427/561; 427/586
(58) Field of Search ......................... 427/596, 597, 427/561, 586, 212, 213, 215, 216, 217, 600, 601

(56) References Cited

U.S. PATENT DOCUMENTS

| | | | |
|---|---|---|---|
| 4,425,376 | * 1/1984 | Lee | 427/57 |
| 5,220,099 | 6/1993 | Schreiner et al. | 585/820 |
| 5,569,502 | * 10/1996 | Koinuma et al. | 427/600 |
| 5,731,488 | 3/1998 | Plee | 585/820 |
| 5,827,264 | * 10/1998 | Hohla | 606/5 |
| 5,828,542 | * 10/1998 | Riley et al. | 361/280 |

FOREIGN PATENT DOCUMENTS

WO 99/21923    5/1999    (WO) .

OTHER PUBLICATIONS

Balkus et al., "A Capacitance–type Chemical Sensor that employs VAPO–5, MnAPO–5 and MAPO–36 molecular sieves as the dielectric phase," *Sens. Actuators B.*, 42:67–79, 1997.

Balkus et al., "The synthesis and characterization of UTD–1: The first large pore zeolite based on a 14 membered ring system," *Stud. Surf. Sci. Catal.*, 105:415–421, 1997.

Balkus et al., "The preparation and characterization of $AlPO_4$ thin films via laser ablation of $AlPO_4-H_4$," *Thin Solid Films*, 260:4–9, 1995.

Barrett et al., "Structure of ITQ–4, a new pure silica polymorph containing large pores and a large void volume," *Chem. Mater.*, 9:1713–1715, 1997.

Coronas et al., "Characterization and permeation properties of ZSM–5 tubular membranes," *AIChE J.*, 43:1797–1812, 1997.

Davis et al., "Bacterial templating of ordered macrostructures in silica and silica–surfactant mesophases," *Nature*, 385:420–423, 1997.

Edler and White, "Further improvements in the long–range order of MCM–41 materials," *Chem. Mater.*, 5:1226–1233, 1997.

Feng et al., "Morphology definition by disclinations and dislocations in a mesostructured silicate crystal," *App. Phys. Lett.*, 71(13):1887–1889, 1997.

Geus et al., "Synthesis and characterization of Zeolite (MFI) membranes on porous ceramic supports," *J. Chem. Soc., Faraday Trans.*, 88:3101–3109, 1992.

Gimon–Kinsel et al., "Photoluminescent properties of MCM–41 molecular sieves" *Micropor. Mater.*, 20:67–76, 1998.

(List continued on next page.)

Primary Examiner—Shrive Beck
Assistant Examiner—Jennifer Kolb
(74) Attorney, Agent, or Firm—Fulbright & Jaworski, LLP

(57) ABSTRACT

A method of coating a substrate with an oriented film. A target is ablated to create a plume. The substrate is manipulated, which may be by vibration, in the plume to coat the substrate with a film. The film is heated in a synthesis gel of the target to form the oriented film.

30 Claims, 6 Drawing Sheets

OTHER PUBLICATIONS

Gimon–Kinsel and Balkus, "Pulsed laser deposition of mesoporous niobium oxide thin films and application as chemical sensors," *Micropor. Mesopor. Mater.*, 28:113–123, 1999.

Hillhouse et al., "Preparation of supported mesoporous silica layers in a continuous flow cell," *Chem. Mater.*, 9:1505–1507, 1997.

Jansen et al., "Preparation of coatings of molecular sieve crystals for catalysis and separation," *Stud. Surf. Sci. Catal.*, 85:215–250, 1994.

Jia et al., "Ceramic–zeolite composite membranes and their application for separation of vapor/gas mixtures," *J. Membr. Sci.*, 90:1–10, 1994.

Karlsson et al., "Synthesis optimization of mesoporous MCM–41 materials in acidic media," *Mater. Res. Soc. Symp. Proc.*, 454:113–117, 1997.

Koegler et al., "Synthesis of films of oriented silicalite–1 crystals using microwave heating," *Stud. Surf. Sci. Catal.*, 105:2163–2170, 1997.

Kolsch et al., "Preparation and testing of silicalite–in–metal–membranes," *Stud. Surf. Sci. Catal.*, 84:1075–1082, 1994.

Kondo et al., "Tubular–type pervaporation module with zeolite NaA membrane," *J. Membr. Sci.*, 133:133–141, 1994.

Kusakabe et al., "Preparation of MFI–type zeolite membranes and their use in separating n–butane and I–butane," *J. Chem. Eng. Jap.*, 30(1):72–78, 1996.

Lu et al., "Continuous formation of supported cubic and hexagonal mesoporous films by sol–gel dip–coating," *Nature*, 389:364–368, 1997.

Liu et al., "Preparation of continuous mesoporous films on porous and dense substrates," *Mater. Res. Soc. Symp. Proc.*, 431:245–250, 1996.

Manne and Gaub, "Molecular organization of surfactants at solid–liquid interfaces," *Science*, 270:1480–1482, 1995.

Matsukata et al., "Zeolitic Membrane Synthesized on a Porous Alumina Support," *J. Chem Soc. Chem. Comm.*, 339–340, 1994.

Mojie et al., "Growth of oriented zeolite crystal membranes," *Stud. Surf. Sci. Catal.*, 105:2233–2240, 1997.

Moller and Bein, "Inclusion chemistry in periodic mesoporous hosts," *J. Chem. Mater.*, 10:2950–2063, 1998.

Lin and Mou, "Tubules–within–a–tubule" Hierarchical order of mesoporous molecular sieves in MCM–41, *Science*, 273:765–768, 1996.

Nishiyama et al., "Mesoporous MCM–48 membrane synthesized on a porous stainless steel support," *J. Chem. Soc. Chem. Commun.*, 2147–2148, 1999.

Nishiyama et al., "A defect–free mordenite membrane synthesized by vapour–phase transport method," *J. Chem. Soc., Chem. Commun.*, 1967–1968, 1995.

Nishiyama et al., "Synthesis of FER membrane on an alumina support and its separation properties," *Stud. Surf. Sci. Catal.*, 105:2195–2202, 1997.

Ozin et al., "Nucleation, growth and form of mesoporous silica: role of defects and a language of shape," *Stud. Surf. Sci. Cat.*, 117:119–127, 1998.

Sano et al., "New preparation method for highly siliceous zeolite films," *J. Mater. Chem.*, 2:141–142, 1992.

Xu et al., "A novel method for the preparation of Zeolite ZSM–5," *J. Chem. Soc. Chem. Commun.*, 755–756, 1990.

Yan et al., "Zeolite ZSM–5 membranes grown on porous α–$Al_2O_3$," *Chem. Soc., Chem. Commun.*, 227–228, 1995.

Yang et al., "Synthesis of oriented films of mesoporous silica on mica," *Nature*, 379:703–705, 1996.

Yang et al., "Morphogenesis of shapes and surface patterns in mesoporous silica," *Nature*, 386:692–695, 1997.

Yang et al., "Thickness control and defects in oriented mesoporous silica films," *J. Mater. Chem.*, 8:1205–1211, 1998.

Zhao et al., "Synthesis of continuous mesoporous silica thin films with three–dimensional accessible pore structures," *Chem. Soc. Chem. Comm.*, 22:2499–2500, 1998.

Zhu et al., "Thickness and stability of adsorbed film in cylindrical mesopores," *J. Phys. Chem. B.*, 102:7371–7376, 1998.

Fitzgerald et al., "Novel method for controlling nano thin coatings on particulate matter," *Mat. Res. Soc. Symp. Proc.*, 526:105–110, 1998.

Jansen et al., "Zeolitic coatings and their potential uses in catalysis," *Micropor. Mesopor. Mater.*,21:213–226, 1998.

Sano et al., "Preparation and characterization of ZSM–5 zeolite film," *Zeolites*, 11:842–845, 1991.

Tsikoyiannis and Haag, "Synthesis and characterization of a pure zeolitic membrane" *Zeolites*, 12:126–130, 1992.

Balkus, et al., "A Capacitance Type Chemical Sensor Based on $AlPO_4$–5 Molecular Sieves," *Chem. Mater.*, 9(1):380–386, 1997.

Balkus et al., "Molecular Sieve Synthesis Using Metallocenes as Structure Directing Agents," *Mater Res. Soc. Symp. Proc.*, 368:369–375, 1995.

Balkus et al., "Synthesis and Characterization of UTD–1 A Novel Zeolite Molecular Sieve," *Chem. Ind.*, 69:77–91, 1996.

Balkus et al., "Titanium Modified UTD–1 as a Catalyst for Oxidation Reactions," Proc. of 12th Int. Zeolite Conf., 1403–1408, 1998.

Balkus et al., "Preparation of Zeolite UTD–1 Films by Pulsed Laser Ablation: Evidence for Oriented Crystal Growth," *Chem. Mater.*, 10:464–66, 1998.

Balkus et al., "Molecular Sieve Films Via Laser Ablation," *Mater. Res. Soc. Symp. Proc.*, 351:437–442, 1994.

Balkus et al., "Molecular Sieve Based Chemical Sensors," *Mater Res. Soc. Symp. Proc.*, 371:33–38, 1995.

Balkus and Scott, "Zeolite Coatings on Three–Dimensional Objects via Laser Ablation," *Chem. Mater.*, 11(2):189–191, 1999.

Bein, "Supramolecular Architecture: Tailoring Structure and Function of Extended Assemblies," *ACS. Symp. Ser.*, 499:1–7, 1992.

Bein, et al., "Molecular Sieve Sensors for Selective Detection at the Nanagram Level," *J. Am. Chem. Soc.*, 19:7640–7641, 1989.

Bein, "Synthesis and Applications of Molecular Sieve Layers and Membranes," *Chem. Mater.*, 8:1636–1653, 1996.

Belouet, "Thin film growth by the pulsed laser assisted deposition technique," *Appl. Surf. Sci.*, 96–98:630–642, 1996.

Bjorklund, et al., "Vapor Adsorption in Thin Silicalite–1 Films Studies by Spectroscopic Ellipsometry," *J. Phys. Chem. B.*, 102:2245–2250, 1998.

Boudreau and Tsapatsis, "A highly oriented thin film of Zeolite A," *Chem. Mater.*, 9:1705–1709, 1997.

Chrisey and Hubler (Eds.), In: *Pulsed Laser Deposition of Thin Films*, Wiley, New York, 1994.

Creasy, et al., "Molecular Design of Aluminosilicate Thin Film Devices," Mater. Res. Soc. Symp. Proc., 233:157–167, 1991.

Dong and Lin, "In Situ Synthesis of P–Type Zeolite Membranes on Porous α–Alumina Supports," *Ind. Eng. Chem. Res.*, 6:2404–2409, 1998.

Freyhardt et al., "A High–silica Zeolite with a 14–tetrahedral–atom pore opening," *Nature*, 381:295–298, 1996.

Gouziniz and Tsaptasis, "On the Preferred Orientation and Microstructural Manipulation of Molecular Sieve Films Prepared by Secondary Growth," *Chem. Mater.*, 9:2497–2504, 1998.

Hedlun, et al., "Ultrathin oriented zeolite LTA films," *J. Chem. Soc. Chem. Commun.*, 13:1193–1194, 1997.

Hopfe, et al., "Laser based coating and modification of carbon fibres: application of industrial lasers to manufacturing of composite materials," *Appl. Surf Sci.*, 106:60–66, 1995.

Karle, et al., "Zeolite Membranes from Kaolin," Mater. Res. Soc. Symp. Proc., 431:237–244, 1996.

Larciprete, et al., "Organotin films deposited by laser–induced CVD as active layers in chemical gas sensors," *Thin Solid Films*, 323:291–295, 1998.

Lobo et al., "Characterization of the extra–large–pore zeolite UTD–1," *J. Am. Chem. Soc.*, 119(36), 8474–8484, 1997.

Lovallo, et al., "Preparation of Supported Zeolite Films and Layers: Processing of Zeolite Suspensions and In Situ Growth From Homogenous Solutions," Mater. Res. Soc. Symp. Proc., 431:225–236, 1996.

Lovallo et al., "Preparation of an Asymmetric Zeolite L Film," *Chem. Mater.* 8:1579–1583, 1996.

Matsukata et al., "Zeolitic Membrane Synthesized on a Porous Alumina Support," *J. Chem. Soc. Chem. Comm.*, 339–340, 1994.

Matsukata, et al., "Preparation of a thin zeolitic membrane," *Stud. Surf Sci. Cat.*, 84:1183–1190, 1994.

Medvecky et al., "Possibilities of coating of glass with synthetic zeolites," *Mater. Sci. Lett.*, 12:907–909, 1993.

Mintova, et al., "Nanosized AlPO$_4$–5 Molecular Sieves and Ultrathin Films Prepared by Microwave Synthesis," *Chem. Mater.*, 10:4030–4036, 1998.

Mintova, et al., "In situ deposition of silicalite–1 on ZrO$_2$ fibres," *Mater. Sci. Lett.*, 10:840–841, 1996.

Munoz and Balkus, "Preparation of Oriented Zeolite UTD–1 Membrane via Pulsed Laser Ablation," *J. Am. Chem. Soc.*, 121(1):139–146, 1999.

Munoz and Balkus, "Preparation of FeAPO–5 molecular sieve thin films and application as a capacitive type humidity sensor," *Chem. Mater.*, 10:4114–4122, 1998.

Roser, et al., "X–Ray reflection studies on the monolayer–mediated growth of mesostructured MCM–41 silica at the air/water interface," *Chem. Commun.*,829–830, 1998.

Segal, et al., "Thin Films of Octahedral Molecular Sieves of Manganese Oxide," *Chem. Mater.*, 9, 98–104, 1997.

Tolbert, et al., "Magnetic Field Alignment of Ordered Silicate–Surfactant Composites and Mesoporous Silica," *Science*, 278:264–268, 1997.

Tsapatsis, et al., "Synthesis and Structure of Ultrafine Zeolite KL (LTL) Crystallites and their Use for Thin Film Zeolite Processing,", Mater. Res. Soc. Symp., 371:21–26, 1995.

Wang, et al., "Very Low Temperature Deposition of Polycrystalline Si Films Fabricated by Hydrogen Dilution with Electron Cyclotron Resonance Chemical Vapor Deposition," *J. Appl. Phys.*, 28:927–931, 1995.

Yan and Bein, "Zeolite Thin Films with Tunable Molecular Sieve Function," *J. Am. Chem. Soc.*, 40:9990–9994, 1995.

Yan, et al., "Growth and Engineering of Microporous Zeolite Films and Coatings," Mater Res. Soc. Symp. Proc., 431:211–216, 1996.

Fitz–Gerald et al., "Significant reduction of cathodoluminescent degradation in sulfide–based phosphors," *Applied Physics Letters*, 72:1838–1839, 1998.

Peachey and Dye, "Pulsed laser deposition of zeolitic thin films: novel structures for molecular recognition," *J Porous Materials*, 2:331–339, 1996.

Balkus et al., "Molecular Sieve Thin Film Via Laser Ablation" Mater Res. Soc. Symp. Proc., 351: pp. 437–442, 1994.*

Munoz and Balkus, "Preparation of Oriented Zeolite UTD–1 Membranes via Pulsed Laser Ablation," J. Am. Chem. Soc., 121: pp. 139–146, Dec. 1998.*

* cited by examiner

US 6,274,207 B1

METHOD OF COATING THREE DIMENSIONAL OBJECTS WITH MOLECULAR SIEVES

The government may own rights in the present invention pursuant to grant number 009741-055, UTD Account No. 2-23206, from Texas Higher Education Coordinating Board—Advanced Technology Program.

BACKGROUND OF THE INVENTION

1. Field of the Invention

The present invention relates to a method of coating three dimensional and non-uniform objects with molecular sieves using pulsed laser deposition.

2. Description of Related Art

There are a variety of methods for fabricating molecular sieves into thin films. A popular approach is the seed method, which involves the deposition of colloidal suspensions of zeolite nanosols onto a flat substrate followed by a controlled secondary growth of the nanoparticles. The resulting films are generally continuous and sometimes oriented. It appears, however, that the seed method works best with only a few types of zeolites, especially those with crystal morphologies that efficiently pack on the substrate surface such as zeolite NaA or ZSM-5. This also implies that this method works best on flat surfaces. Consequently, there are relatively few examples of zeolite films and no examples of oriented films on non-planar surfaces.

The deposition-during-synthesis technique has been used to grow zeolite Beta onto macroporous alumina spheres with a 4% loading by immersing the support in the synthesis mixture. Analogously, metal and ceramic monoliths have also been coated with zeolite Beta, Mordenite, and ZSM-5 utilizing this technique. Molecular sieve films prepared by the direct deposition of crystals from solution, however, often suffer from defects and poor adhesion. Furthermore, controlling the film thickness and orientation can be quite a challenge.

SUMMARY OF THE INVENTION

In one respect, the invention is a method of coating a substrate. A target is provided. Material is ablated from the target to create a plume. The substrate is manipulated in the plume to coat the substrate with a film, and the film is heated in a synthesis gel of the target. In another respect, the invention is a coated substrate made by this method.

In other aspects, the heating of the film forms an oriented film. The oriented film may include crystals normal to the surface of the substrate. The target may include a zeolite. The zeolite may include at least one of UTD-1, ZSM-5, Beta, Mordenite, NaX, NaA, SSZ-33, SSZ-31, SSZ-42, MCM-22, or a mixture thereof. The target may include a phosphate. The phosphate may include an aluminum phosphate. The aluminum phosphate may include at least one of VPI-5, AlPO$_4$-5, AlPO$_4$-8, or a mixture thereof. The phosphate may include a silicon aluminum phosphate. The silicon aluminum phosphate may include at least one of SAPO-5, SAPO-37, SAPO-42, or a mixture thereof. The phosphate may include a metal aluminum phosphate. The metal aluminum phosphate may include at least one of MAPO-39, MAPO-5, MAPO-11, UCSB-6, UCSB-7, or a mixture thereof. The target may include a mesoporous molecular sieve. The mesoporous molecular sieve may include at least one of MCM-41, MCM-48, SBA-15, SBA-16, Nb-TMS-1, Ti-TMS-1, Ta-TMS-1, or a mixture thereof.

The ablating may include subjecting the target to pulsed radiation from an excimer laser. The laser may include a KrF* laser operating between about 70 and about 200 mJ/pulse with a repetition rate between about 1 and about 50 Hz. The manipulating may include moving the plume relative to the substrate. The manipulating may include vibrating the substrate. The heating may include heating between about 1 hour and about 200 hours. The method may also include adjusting a background pressure of the substrate to between about 150 mTorr and about 350 mTorr. The background pressure may include a background pressure of $O_2$. The substrate may include a zeolite crystal, glass, metal, metal oxide, or plastic. The substrate may include a porous substrate. The largest dimension of the substrate may be between about 10 nm and about 10 mm. The substrate may be spherical. The method may also include washing or calcining the oriented film.

In another respect, the invention is a method of coating a substrate with an oriented film. A target including $Cp^*_2Co^+$ or $Cp_2Fe$ is provided. Material is laser ablated from the target to create a plume. The substrate is vibrated in the plume to coat a film on the substrate, and the film is heated in a synthesis gel of the target to form the oriented film. In another respect, the invention is a coated substrate made by this method.

In other aspects, the laser ablating may include a first stage and a second stage. The first stage ablates material at a first laser power and the second stage ablates material at a second laser power, the first laser power being different than the second laser power.

In another respect, the invention is a method of coating a substrate with an oriented film. A target including $Cp^*_2Co^+$ or $Cp_2Fe$ is provided. Pulsed laser radiation having an energy between about 70 mJ/pulse and about 200 mJ/pulse at a repetition rate of between about 1 Hz and about 50 Hz is directed to the target to create a plume. The substrate is heated. A pressure between about 150 mTorr and about 350 mTorr about the substrate is maintained. The substrate is vibrated within the plume to coat a film on the substrate, and the film is heated in a synthesis gel of the target to form the oriented film. In another respect, the invention is a coated substrate made by this method.

In other aspects, the method may also include washing or calcining the oriented film.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

Figure 1A:
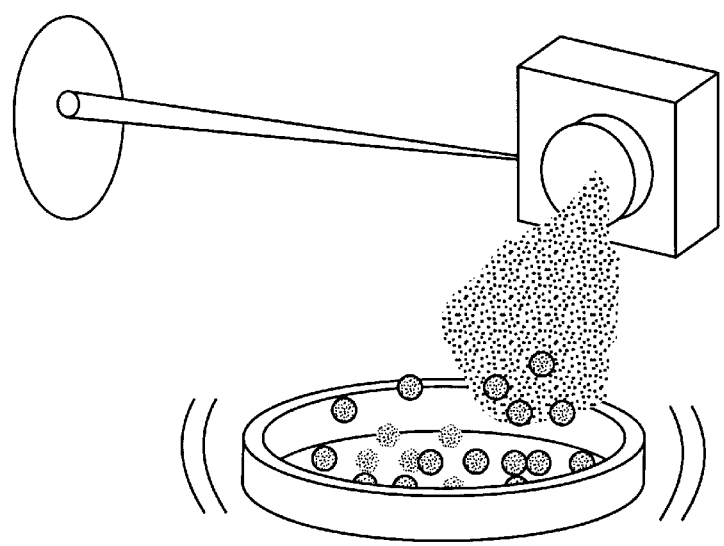
FIG. 1A. Schematic diagram of 3-D objects manipulated in a laser ablation plume by vibration.

Laser ablation offers a distinct advantage of being able to coat non-planar surfaces by manipulating an object in a laser ablation plume or by manipulating the direction of the plume. Using the disclosed methods, the utility of pulsed laser deposition (PLD) may be extended to include microscale objects such as catalyst particles and catalyst supports. In order to evenly coat three-dimensional objects by PLD, one may move the objects in the ablation plume or may likewise move the plume relative to the object. Mechanical manipulation may not always be feasible on small length scales. However, a method of vibrating an object in a laser ablation plume sufficiently manipulates an object to ensure that it is coated in three-dimensions.

In one disclosed embodiment, a pancake vibrator may provide sufficient motion for small substrates, such as metal or glass beads, in an ablation plume to be evenly coated with zeolites, phosphates, mesoporous materials, or other materials. For example, the presently disclosed methods may be used to coat three dimensional objects with a molecular sieve coating. A three dimensional substrate may be placed in or on a vibrating apparatus and may be subjected to a plume generated by laser ablation of a target. The vibrating medium may rotate and generally, manipulate, the substrate, exposing, over time, its entirety to the plume to form a laser-deposited film covering the substrate. The substrate may then be hydrothermally treated to form an oriented coating.

In one embodiment, post hydrothermal treatment includes heating PLD coated substrates in a synthesis gel of the material used as a target during ablation. Thus, in embodiments utilizing a UTD-1 target, post hydrothermal treatment may include heating UTD-1 PLD substrates in a UTD-1 synthesis gel, while for MAPO-39 coatings a WAPO-39 synthesis gel may be used. Heating times, temperatures, and conditions may be varied to achieve an oriented film. In a particular UTD-1 embodiment, however, heating may be at about 175° C. for about 72 hours.

In one embodiment, crystals may be oriented so that one-dimensional channels may be normal to the substrate. A detailed discussion of methods used to form oriented films using laser ablation may be found in co-pending U.S. patent application Ser. No. 09/315,805 filed May 21, 1999 and entitled, "Preparation Of Laser Deposited Oriented Films And Membranes" by Kenneth J. Balkus, Jr., Mary E. Kinsel, and Lisa L. Washmon, which is incorporated herein by reference in its entirety.

In one embodiment, small (about 75 $\mu$m) beads may be coated with an oriented film via laser ablation. The coating may be with UTD-1 molecular sieves, but it will be understood with the benefit of the present disclosure that a variety of other materials including, but not limited to, zeolites such as ZSM-5, Beta, Mordenite, NaX, NaA, SSZ-33, SSZ-31, SSZ-42, MCM-22, aluminum phosphates such as VPI-5, $AlPO_4$-5, $AlPO_4$-8; silicon aluminum phosphates such as SAPO-5, SAPO-37, SAPO-42; metal aluminum phosphates such as MAPO-39, MAPO-5, MAPO-11, UCSB-6, UCSB-7; mesoporous molecular sieves such as MCM-41, MCM-48, SBA-15, SBA-16, Nb-TMS-1, Ti-TMS-1, and Ta-TMS-1 may be used as a coating as well. Thus, although description herein may be directed to, for example, UTD-1 coatings for convenience, those having skill in the art will understand that description herein applies to many other coating materials as well including, but not limited to, the coatings listed above. Targets used in methods described herein may include an ultraviolet absorbing material including, but not limited, to, the organometallic cobalticinium ion $Cp^*_2Co^+$ or the related ferrocene $Cp_2Fe$ to facilitate ablation. It will be understood that other UV absorbing materials suitable for aiding in ablation may be substituted therewith.

Substrates may be various materials and may include, but are not limited to, zeolite crystals, glass, metal, metal oxide, or plastics. Substrates may be of various configurations including, but not limited to, flat substrates or substrates having a non-planar topology. Substrates may be of any shape and/or size suitable for applying a coating by the methods described herein. In one embodiment, substrates may include fibers, such as optical fibers.

Figure 2:
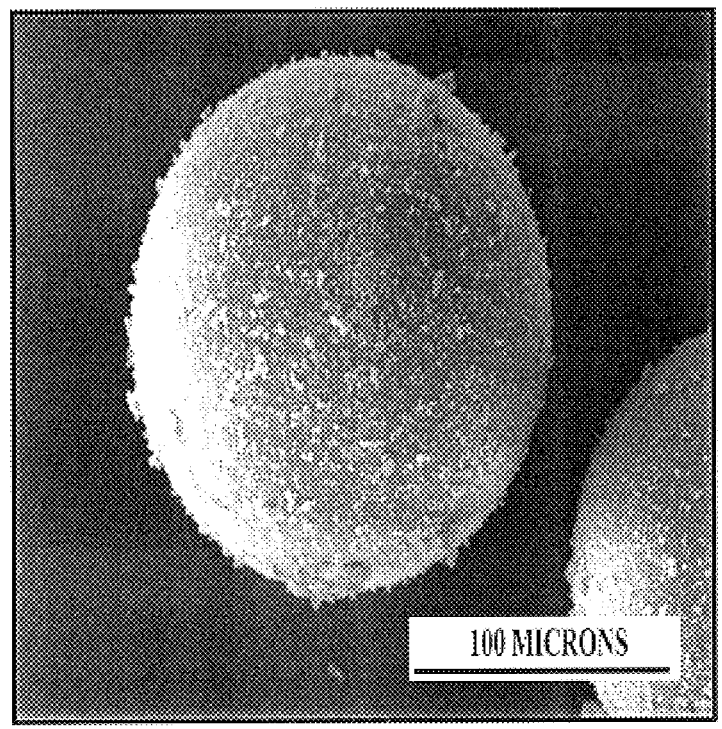
FIG. 2. Scanning electron micrograph of pulsed-laser deposited (PLD) glass bead after a multi-staged deposition time of 35 min.

In one embodiment, about 0.025 g (which may be equivalent to about 100 small spherical beads) may be loaded into a substrate holder, configured to vibrate, without any pre-treatment. The vibrating substrate holder allows the beads to move and rotate freely in a UTD-1 laser ablation plume. In this embodiment, the laser ablation of an as-synthesized UTD-1 target for about 5 minutes at a power of about 159 mJ/pulse results in coated beads as shown in FIG. 2.

When high laser power of about 100 to about 150 mJ/pulse is used, the laser beam may tend to eject some large fragments of the UTD-1 target material onto the surface of the substrate. Thus, a lower laser power from about 50 to about 80 mJ/pulse may be used to achieve less target splashing on the surface.

Other embodiments achieving an ablated film that is continuous and thick enough to provide a protective covering for a glass substrate may involve increasing deposition time from between about 5 to about 25 minutes, followed by an additional 10 minutes to provide a PLD film of greater than about 1.75 $\mu$m.

In such an embodiment, the first coating may be done utilizing low laser power (about 69 mJ/pulse) that provides a tight, densely packed uniform film with less splashing of the target material. A second coating may be applied utilizing a higher laser power (about 138 mJ/pulse) for about 10 minutes during which some splashing may occur. In this embodiment, the glass beads may be completely coated with a thick PLD film.

FIG. 2 shows an SEM image of a multi-staged PLD glass bead that was coated for about 25 minutes at low laser power, and for about 10 minutes at high laser power. This image shows no evidence of any discontinuity on the surface of the substrate. The larger fragments from splashing may be seen dispersed around the entire glass bead surface. It appears that the large fragments from splashing are sitting on top of the thin layer of the laser deposited zeolite film.

Figure 3A:
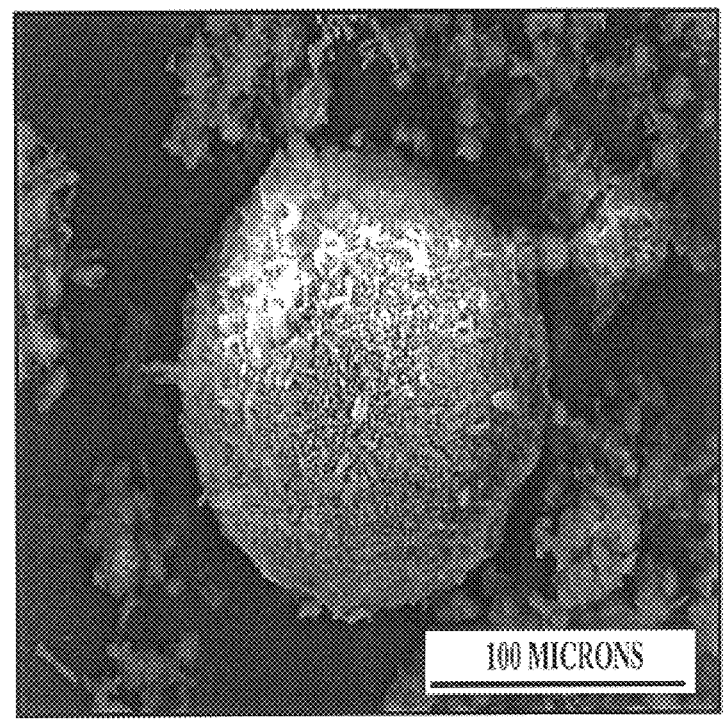
FIG. 3A. Scanning electron micrograph of post hydrothermally treated PLD glass beads after a multi-staged deposition time of 35 min.

A post hydrothermal treatment may be applied to the thickly coated film as described herein. FIG. 3A shows an SEM image of a glass bead after post hydrothermal treatment, and it may be noted that the original size of the glass bead here was not diminished. In fact, the diameter of the glass bead increased from about 75 μm to about 90 μm. Random crystal aggregates obtained from a synthesis gel used in the post hydrothermal treatment may be seen in the background of the image. UTD-1 crystals appear to be attached to the glass beads radiating up from the glass bead surface.

Figure 3B:
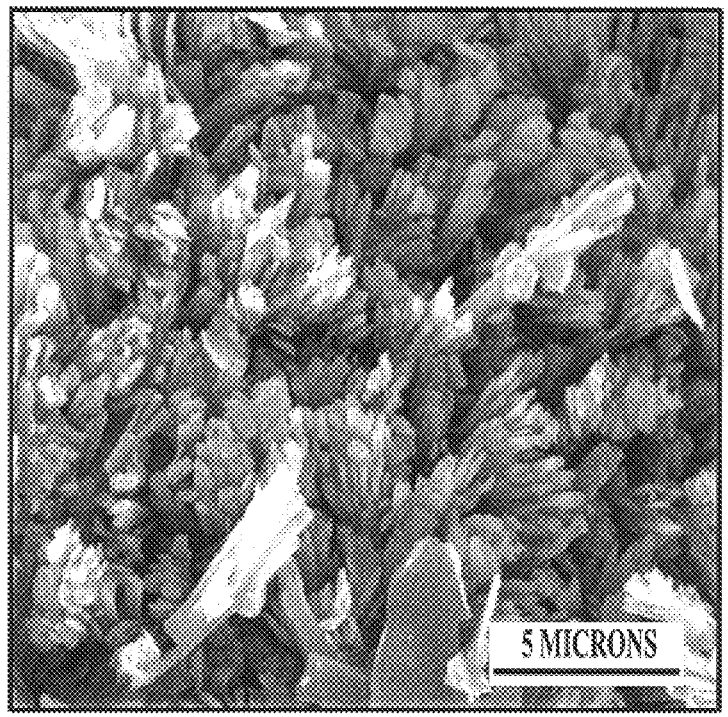
FIG. 3B. Higher magnification scanning electron micrograph of post hydrothermally treated PLD glass beads after a multi-staged deposition time of 35 min.

FIG. 3B shows an SEM image taken at a higher magnification of the hydrothermally treated glass bead. The UTD-1 crystals may be seen radiating up from the laser deposited surface with plank-like morphology. The crystals appear to be normal to the surface of the spheres, creating a preferred orientation of the UTD-1 crystals in which the one-dimensional channels run in parallel along the length of the planks. Loosely attached random crystals may also be seen on the surface of the oriented crystals. X-ray diffraction analysis confirms the phase identity of UTD-1.

Figure 4:
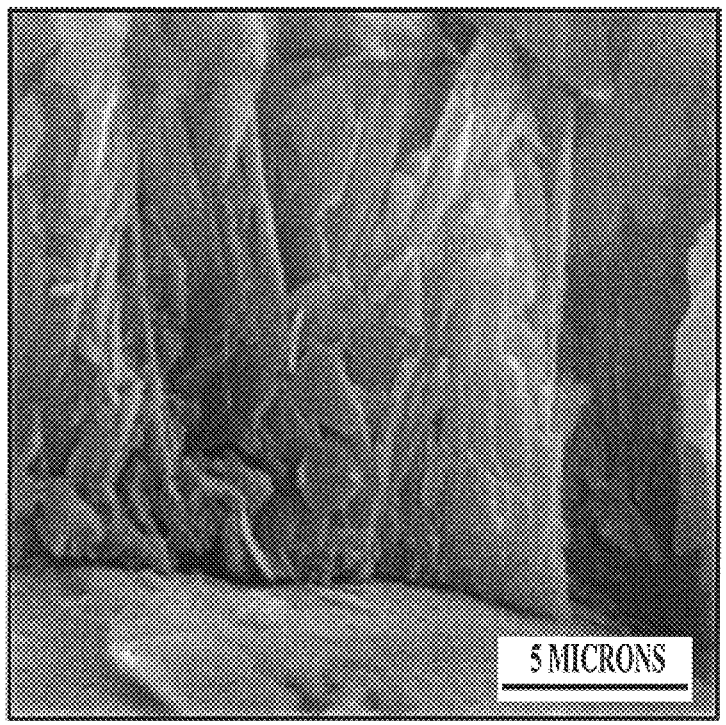
FIG. 4. Cross section of post hydrothermally treated PLD glass beads after a multi-staged deposition time of 35 min.

A cross section of the UTD-1 PLD film may be taken in order to obtain a film thickness of a post hydrothermally treated PLD film. FIG. 4 shows an SEM image in which UTD-1 crystals may be seen radiating up from the surface of the glass bead. The crystals also appeared to be densely packed, which is consistent with the theory that as the fragments reorganize they are forced to grow substantially vertically. The film appears to be in the range of about 7 to about 9 microns thick. This is consistent with the increase in diameter of the glass bead substrate shown in FIG. 3A.

The preferred orientation of the reorganized film is also comparable to thick films (about 11 μm) that have been formed on flat substrates after pulsed laser deposition (PLD). However, crystals on flat substrates have appeared to be more densely packed at the surface due to the planar morphology of the substrate. Additionally, the crystals from the glass beads appeared to be smaller than the crystals generated from the flat substrates, while being larger than the crystals generated in the bulk gel synthesis.

It appeared that the crystals may be strongly adhered to the surface of the substrate since there was no loss of film upon handling. Glass substrates used herein were too small to under go a scratch test to confirm film adhesion. Retention of the film after sonication may, however, be supporting evidence for the strong adhesion of the film to the substrate. Therefore, glass beads may be subjected to a one-hour sonication in deionized water to test the adhesion of the films.

Figure 5:
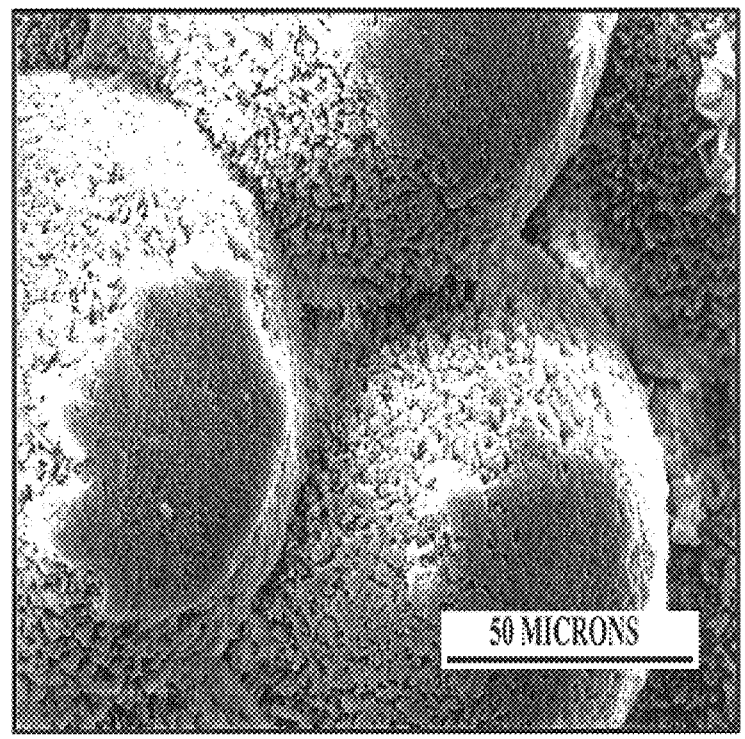
FIG. 5. Higher magnification scanning electron micrograph of hydrothermally treated PLD glass beads after sonicating for one hour in deionized water.

FIG. 5 shows an SEM image of glass beads after such sonication. In FIG. 5, the UTD-1 hydrothermally treated film appeared to still be attached to the glass beads after sonication. FIG. 5 illustrates a consequence of a static hydrothermal treatment. Some of the glass beads in the figures appeared to have oriented themselves in a close-packing arrangement, and it appeared that they were held together by inter-grown crystals. Also, FIG. 5 shows the effect of the beads resting in the bottom of the reactor, where flat spots may be seen. In light of this, a re-growth step may benefit from a stirred or rotated system so the beads may remain dispersed in the post hydrothermal treatment. This image reveals the UTD-1 crystal radiating themselves around the glass beads. The sonication test supported the proposition that the hydrothermally treated films were well adhered to glass substrates.

Figure 6:
FIG. 6. Scanning electron micrograph of hydrothermally treated PLD glass beads after calcining in air at about 550° C. for about 6 hours.
Figure 9:
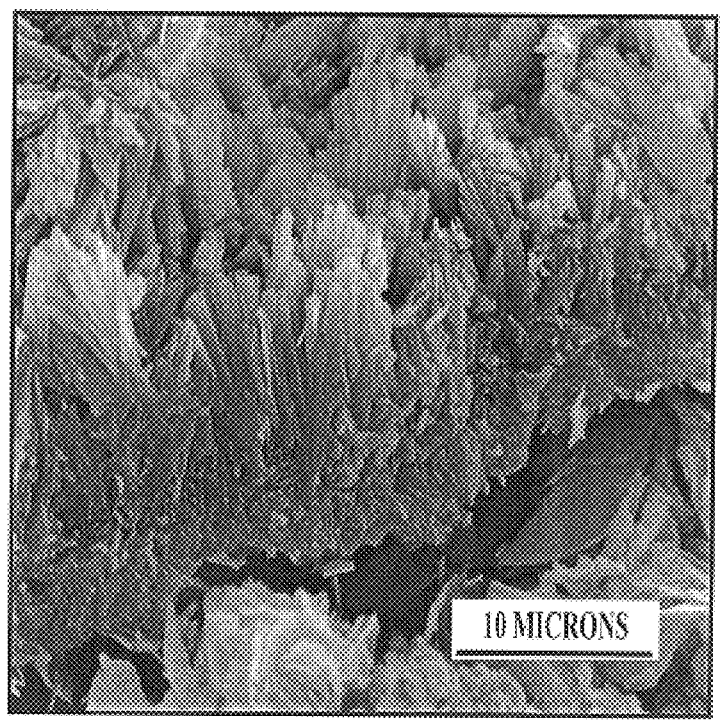
FIG. 9. Cross section of a post hydrothermally treated PLD metal bead.

Thermal stability of films prepared in accordance with the present disclosure may be tested by calcining glass beads in air at about 550° C. for about 5 hours. After calcination, the film may change from a yellow color to a gray color upon decomposition of bis(pentamethylcyclopentadienly)cobalt (III) ion $Cp*_2Co^+$ template in the post hydrothermal treatment gel. The SEM image of FIG. 6 revealed that an oriented UTD-1 film may still remain on a glass bead even after thermal stress. In FIG. 9, there were some randomly oriented crystals on the surface of the oriented crystals that were probably deposited from the bulk gel.

The above data provided evidence that post hydrothermally grown films on 3-D objects may become well adhered to a substrate and that they may be thermally stable up to temperatures of at least about 550° C.

In one embodiment, PLD films may be grown on three-dimensional metal substrates. Metal spheres, including steel spheres, may be used as substrates. In one embodiment, spherical, zinc galvanized coated steel buck shot pellets measuring about 0.5 mm in diameter may be used as substrates. In one embodiment, untreated metal beads (such as six to eight untreated metal beads) may be loaded into a vibrating substrate holder. Heating the substrates in an oxygen atmosphere may promote adhesion to the interface where the energetic particles form covalent bonds with the metal surface. An oxide linkage at the surface/film interface may account for strong adhesion of the film as shown by the retention of the film to the metal bead after an etching test with a diamond scribe.

In one embodiment, the metal sphere is a fairly smooth non-planar substrate with some imperfections across the surface. It is possible that such scattered defects that are present on the surface may promote film adhesion by providing crevices for the crystals to nucleate. In one example, after pulsed laser deposition of UTD-1 for about 10 minutes at a laser power of about 123 mJ/pulse, a film may be achieved.

Splashing may result in larger fragments on the surface. The UTD-1 fragments from splashing, some as large as a micron, may be evenly dispersed around the surface of the bead. In order to obtain less splashing, a laser power of about 70 mJ/pulse may be used. With the exception of a lower laser power, the deposition parameters may be analogous to the conditions required for flat pulsed laser deposited UTD-1 films as disclosed for example, in co-pending U.S. patent application Ser. No. 09/315,805 filed May 21, 1999 and entitled, "Preparation Of Laser Deposited Oriented Films And Membranes" by Kenneth J. Balkus, Jr., Mary E. Kinsel, and Lisa L. Washmon. By decreasing the laser power, however, a uniform well-adhered thin deposited film may be achieved on the substrate where the PLD fragments were small, tightly packed, and uniform throughout the entire surface of the bead.

Figure 7:
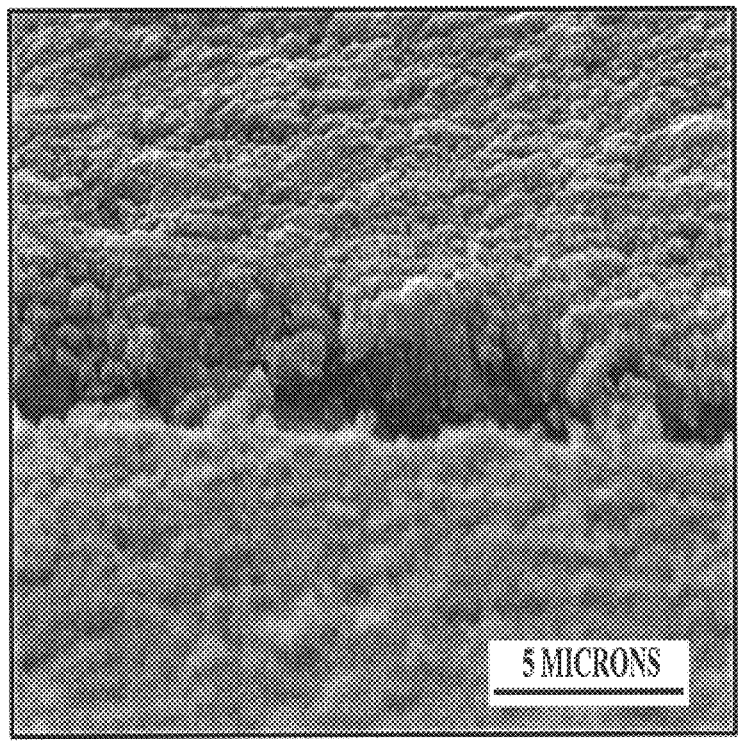
FIG. 7. Cross-section of PLD UTD-1 film covering a metal bead fabricated with about a 13 minute deposition time and about a 70 mJ/pulse laser power.

FIG. 7 shows a cross section of the PLD film. The film was estimated to be about 900 nm thick, which corresponds to a deposition rate of about 70 nm/min. This film was thin compared to the PLD film required for glass beads because the metal beads may better withstand high pH conditions present in the hydrothermal treatment gel. There appeared to be no exposed areas on the surface of the substrate after PLD. The film was still well-adhered to the substrate even after etching the surface with the diamond scribe. A loosely bound film most likely would have flaked off the surface when subjected to such a test.

PLD films from a UTD-1 target were mostly amorphous to x-rays, which is consistent with results obtained with glass beads. In one embodiment, the PLD UTD-1 film coating metal substrates may be hydrothermally treated as previously described by placing the metal balls in a Teflon lined Parr reactor containing the UTD-1 synthesis gel mixture for, in one embodiment, about 72 hours at about 175° C. under static conditions.

Figure 8A:
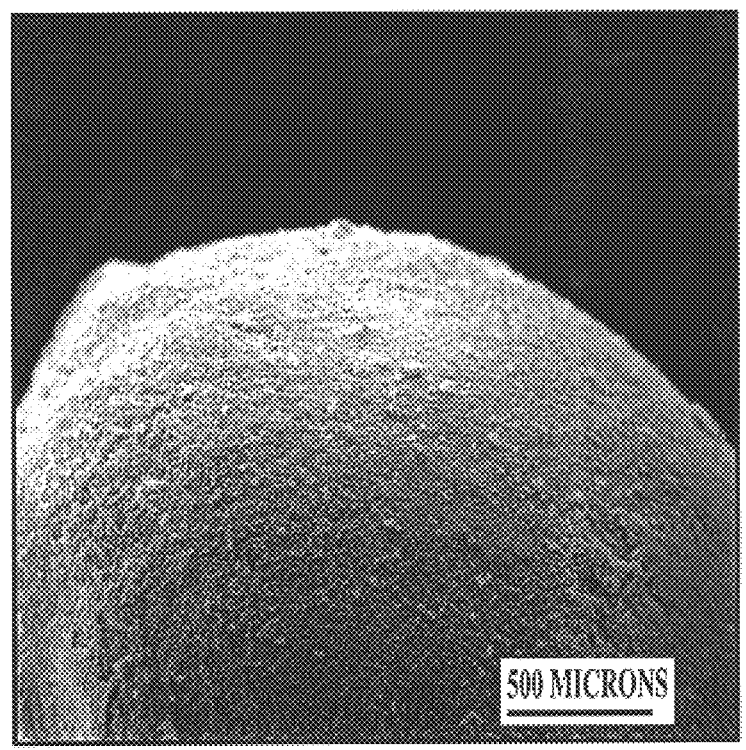
FIG. 8A. Scanning electron micrograph of a post hydrothermally treated PLD metal bead.
Figure 8B:
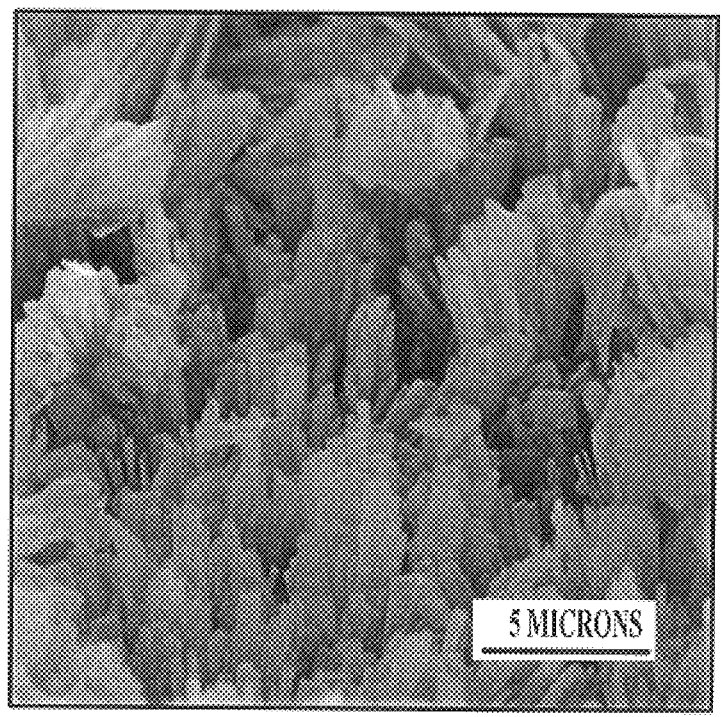
FIG. 8B. Higher magnification scanning electron micrograph of a post hydrothermally treated PLD metal bead.

FIG. 8A and FIG. 8B show SEM images at different magnifications of resulting post hydrothermally treated metal spheres. FIG. 8A shows what appeared to be a new, thick layer surrounding the metal sphere that was not present before hydrothermal treatment. The post hydrothermally treated film was continuous, and covered the entire surface of the bead with no observable voids on the surface. A closer inspection of the thick layer revealed highly crystalline film that was confirmed as UTD-1 by powder x-ray diffraction (XRD).

FIG. 8B shows the UTD-1 crystals having a plank-like morphology radiating up from the substrate surface. The crystals appeared to be normal to the surface of the spheres, creating a preferred orientation of the UTD-1 crystals in which the one-dimensional channels run in parallel along the length of the planks. A cross section of the post hydrothermal PLD film was taken by scratching the film with a diamond scribe.

FIG. 9 shows a scanning electron micrograph of the cross section in which the reorganized film was determined to be about 14 $\mu$m thick. The increased reorganized film thickness of the metal beads may be explained with the increased PLD film associated with the metal beads. Also, as seen in the glass beads, the crystals generated on the metal beads appeared to be smaller than crystals obtained from flat substrates, while being larger than crystals generated from the bulk gel.

The cross section view in FIG. 9 provided a better view of the densely packed crystals growing upwards from the substrate surface. It may be seen that the plank-like morphologies of the crystals preferred to grow perpendicular to the substrate because of the dense crystal packing. There were also some broken random crystal observed on the bead surface, which may be caused by the etching of the film and the crystals that were generated by the bulk gel. These scattered crystals were loosely bound and may be removed by simply blowing air across the substrate.

As a control study, blank beads may also be subjected to a hydrothermal treatment. In this case, UTD-1 crystals are randomly scattered over the surface of the substrate. Such crystals do not radiate perpendicular from the surface as in the case of the PLD crystals. Such crystals were, instead, similar to crystals found in a bulk gel synthesis. Furthermore, the crystals were loosely bound to the bead's surface, as they tended to detach when blowing air over the surface or even when washing with water. This unsuccessful attempt to prepare oriented crystals by direct deposition from the gel indicates that the uniform pulsed laser deposited film may be essential to the formation of well-adhered, continuous, and oriented coatings, including UTD-1 coatings.

In contrast to glass beads which may need a PLD film of about 1.75 $\mu$m, the stability of metal spheres to high pH may allow for oriented growth from PLD films as thin as about 0.9 $\mu$m. The larger metal sphere substrate may generate thicker films than their smaller glass bead counterparts during the crystal reorganization process in the post hydrothermal treatment. The metal beads may have a reorganized crystal growth of about 14 $\mu$m, in contrast to the approximate 9 $\mu$m reorganized crystal growth of the smaller glass beads. Increased crystal growth may be a linear relationship with the size of the substrate. With metal spheres described herein being about 66% larger than the glass beads described herein, more material may be needed to effectively coat the metal spheres, which may give rise to more nucleation sites.

Applications for the presently disclosed methods are vast. Using pulsed laser ablation to coat three dimensional and non-uniform objects may be applied commercially in areas such as, but not limited to, separations, catalysis and chemical sensors. The methods may be used to coat one molecular sieve onto another to enhance catalytic and size-selective properties. Another application may be utilizing molecular sieve coated glass beads to pack IPLC columns which, in turn, may enhance selectivity and separation properties of the column.

The following examples are included to demonstrate specific embodiments of the invention. It should be appreciated by those of skill in the art that the techniques disclosed in the examples which follow represent techniques discovered by the inventors to function well in the practice of the invention, and thus may be considered to constitute specific modes for its practice. However, those of skill in the art should, in light of the present disclosure, appreciate that many changes may be made in the specific embodiments which are disclosed and still obtain a like or similar result without departing from the spirit and scope of the invention.

EXAMPLE 1

Zeolite UTD-1 Coating on Buck Shot Pellets

Zeolite UID-1 was synthesized using bis(pentamethylcyclopentadienly)cobalt (III) hydroxide, $Cp*_2CoOH$, as the template. The substrates in this Example were spherical, zinc galvanized coated steel buck shot pellets measuring about 0.5 mm in diameter and glass beads (Supleco) measuring about 75 $\mu$m in diameter.

Figure 1B:
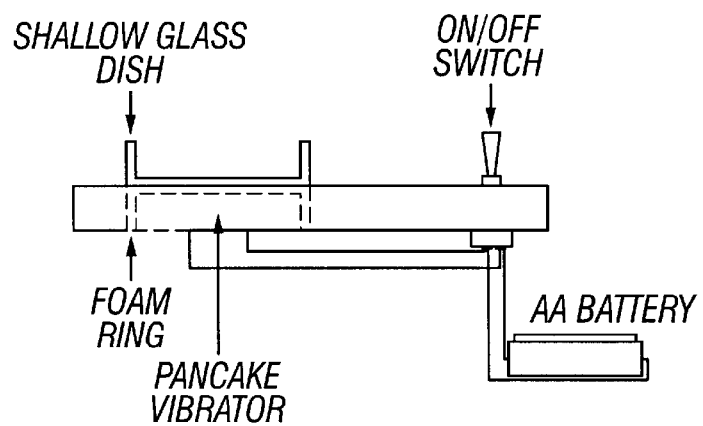
FIG. 1B. Side view schematic of an apparatus for vibrating objects in a laser ablation plume.
Figure 1C:
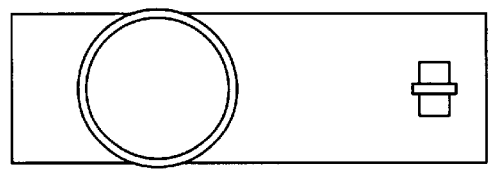
FIG. 1C. Top view schematic of an apparatus for vibrating objects in a laser ablation plume.

A 2.5 cm in diameter pressed pellet of the as-synthesized UTD-1 was mounted in a controlled atmosphere chamber at about a 60° angle about 2.5 cm above the substrate holder as shown in FIGS. 1A–1C. The glass or metal beads were then loaded into a glass dish (about 2.5 cm in diameter and about 1 cm deep) attached to an 8.25×3.2 cm steel plate. The substrate holder sat directly on top of a MOTOROLA® pancake pager vibrator that was controlled by an on/off single speed switch powered by a AA battery. The directional nature of the laser-generated plume allowed substrates to vibrate in the plume and to become evenly coated. Typical experimental conditions were as follows: laser power was about 70 to about 156 mJ/pulse, repetition rate was about 10 Hz, substrate temperature ranged from about 25 to about 60° C., vacuum chamber pressure was about 150 mTorr, and deposition rate was about 70 nm/min at about 70 mJ/pulse on the non-planar metal bead surface.

The PLD UTD-1 coated beads were placed in a 23 ml Teflon lined Parr reactor containing a UTD-1 synthesis gel having a molar ratio of $SiO_2:Na_2O:Cp*_2Co^+:H_2O$ of about 1:0.05:0.1:60. The reactor was heated at about 175° C. for about 72 hours under static conditions. The beads were then separated from the gel by gravity filtration, washed with deionized water, and dried at room temperature. The beads were then calcined in air at about 550° C. for about 6 hours to remove the template.

EXAMPLE 2

Zeolite UTD-1 Coating on Glass Beads and Buck Shot Pellets 75 micron glass beads and galvanized coated stainless buck shot pellets have been coated with UTD-1 by pulsed laser ablation (248 nm, KrF*). Typical experimental conditions were as follows: laser power was about 70 to about 156 mJ/pulse, repetition rate was about 10 Hz, substrate temperature was about 25 to about 59° C., background pressure was about 150 mTorr with $O_2$, deposition rate was about 130 nm/min, deposition time was about 5 minutes to about 13 minutes. The beads or pellets having a UTD-1 coating were placed in a high temperature Teflon liner reactor along with the UTD-1 synthesis gel. A post hydrothermal treatment was then carried out on these laser deposited substrates for about 72 hours in an autoclave at about 175 degrees C. resulting in a continuous highly oriented UTD-1 membrane.

EXAMPLE 3
Zeolite UTD-1 Coating on Glass Beads and Buck Shot Pellets

Glass beads having a diameter of about 75 microns and galvanized coated stainless steel buck shot pellets have been coated with UTD-1 by pulsed laser ablation (248 nm, KrF*). The substrate was placed inside a shallow glass dish, about 2.5 cm in diameter and about 1.21 cm deep, as shown in FIG. 1. The glass dish was mounted on a 8.25"×3.20 cm steel plate, and sat directly on top of a pancake vibrator that was surrounded by a foam ring. The vibrator was controlled by an on/off switch attached to the steel plate, and was powered by a AA battery. The vibrator apparatus was mounted on a 15.24×7.62 cm stainless steel pipe (not shown) that allowed for the substrate to be placed about 2.5 cm from the target. FIG. 1C shows the top view of the vibrator apparatus. Typical experimental conditions were as follows: laser power was about 70 to about 156 mJ/pulse, repetition rate was about 10 Hz, substrate temperature was about 25 to about 59° C., background pressure was about 150 mTorr with $O_2$ and deposition rate was about 130 nm/min. With the vibrator turned on, the pellets vibrated in the plume, allowing the UTD-1 to be deposited uniformly onto the substrates.

A post hydrothermal treatment was then carried out on these laser deposited films by placing the pellets in a gel having a molar patio of $SiO_2:Na_2O:Cp^*_2Co+:H_2O$ of 0.05:0.1:60 for about 72 hours in an autoclave at about 175° C. resulting in a continuous highly oriented UTD-1 membrane.

EXAMPLE 4
CoAPO-5 Crystals

CoAPO-5 crystals were coated onto MAPO-39 crystals by pulsed laser ablation (248 nm, KrF*). The experimental conditions were as follows: laser power was about 71.2 mJ/pulse, repetition rate was about 10 Hz, substrate temperature was about 25° C., background pressure was about 150 mTorr with $O_2$, deposition rate was about 130 nm/min, deposition time was about 7 minutes and 30 seconds. A coating of CoAPO-5 was obtained on the MAPO 39 crystals.

EXAMPLE 5
FeAPO-5 Crystals

FeAPO-5 crystals were coated on MAPO-39 crystals by pulsed laser ablation (248 nm, KrF*). The experimental conditions were as follows: laser power was about 71.2 mJ/pulse, repetition rate was about 10 Hz, substrate temperature was about 25° C., background pressure was about 150 mTorr with $O_2$, deposition rate was about 130 nm/min, and deposition time was about 7 minutes and 30 seconds. A coating of FeAPO- was also achieved on MAPO-39 crystals.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed compositions and methods may be utilized in various combinations and/or independently. Thus the invention is not limited to only those combinations shown herein, but rather may include other combinations.

REFERENCES

The following references, to the extent that they provide exemplary procedural or other details supplementary to those set forth herein, are specifically incorporated herein by reference.

Balkus, Ball, Gimon-Kinsel, Anthony, Gnade, *Sens. Actuators,* 42:67, 1997.
Balkus, Ball, Gnade, Anthony, *Chem. Mater.,* 9:380, 1997.
Balkus, Gabrielov, Sandler, *Mater Res. Soc. Symp. Proc.,* 368:369, 1995.
Balkus, Gabrielov, Zones, Chan, *Chem. Ind.,* 69:77, 1996.
Balkus, Khanmamedova, Scott, Hoefelmeyer, *Proc. of 12th Int. Zeolite Conf.,* 1998.
Balkus, Munoz, Gimon-Kinsel, *Chem. Mater.,* 10:464, 1998.
Balkus, Riley, Gnade, *Mater. Res. Soc. Symp. Proc.,* 351:437, 1994.
Balkus, Sottile, Nguyen, Riley, Gnade, *Mater. Res. Soc. Symp. Proc.,* 371:33, 1995.
Bein and Yan, *ACS Symp. Ser.,* 561:16, 1994.
Bein and Yan, *ACS. Symp. Ser.,* 499:1, 1992.
Bein, Brown, Fry, Binker, *J. Am. Chem. Soc.,* 19:7640, 1989.
Bein, *Chem. Mater.,* 8:1636, 1996.
Belouet, *Appl. Surf. Sci.,* 96–98:630 and references therein, 1996.
Bjorklund, Hedlund, Sterte, Arwin, *Phys. Chem. B.,* 12:2245, 1998.
Chrise and Hubler (Eds.), In: *Pulsed Laser Deposition of Thin Films,* Wiley, New York, 1994.
Creasy, Deng, Park, Borgstedt, Davis, Suib, Shaw, *Mater. Res. Soc. Symp. Proc.,* 233:157, 1991.
Dong and Lin, *Ind Eng. Chem. Res.,* 6:2404, 1998.
Fitzgerald, Pennycook, Gao, Krishnamoorthy, Marcinka, Glenn, Singh, *Mat. Res. Soc. Symp. Proc.,* 526:105, 1998.
Freyhardt, Tsapatisis, Lobo, Balkus, Davis, *Nature,* 381:295, 1996.
Gouziniz and Tsapatsis, *Chem. Mater.,* 10:2497, 1998
Gouziniz and Tsaptasis, *Chem. Mater.,* 9:2497, 1998
Hedlun, Schoeman, Sterte, *J. Chem. Soc. Chem. Commun.,* 13:1193, 1997.
Hopfe, Jaeckel, Shoenfield, *Appl. Surf Sci.,* 106:60, 1995.
Jansen, Koogler, van Bekkum, Calis, van Bleek, Kapteijn, Moulijn, Geus, van der Puil, *Micropor. Mesopor. Mater.,* 21:213, 1998.
Jansen, Nugroho, van Bekkun, *Proc. 9th Int. Zeolite Conf.,* 247, 1992.
Karle, Brinker, Phillips, *Mater. Res. Soc. Symp. Proc.,* 431:237, 1996.
Larciprete, Borsella, DePadova, Perfetti, *Thin Solid Films,* 323:291, 1998.
Lobo, Tsapatisis, Freyhardt, Khodabandeh, Wagner, Chen, Balkus, Zones, Davis, *Am. Chem. Soc.,* 119:8474, 1997.
Lovallo, Boudreau, Tsapatsis, *Mater. Res. Soc. Symp. Proc.,* 431:225, 1996.
Matsukata and Nishiyama, *J. Chem Soc. Chem. Comm.,* 339: 1994.
Matsukata, Ueyama, Mishiyama, *Stud. Surf Sci. Cat.,* 84:1183, 1994.

Medvecky et al., *Mater. Sci. Lett.*, 12:907, 1993.
Mintova and Bein, *Chem. Mater., ACS ASAP*, 1998.
Mintova, Valtchev, Schoeman, *Mater. Sci. Lett.*, 10:840, 1996.
Munoz and Balkus, *J. Am. Chem. Soc.*, 121:139,1999.
Munoz and Balkus, *Chem. Mater.*, 10:4114, 1998.
Peachy and Dye, *J. Porous Mater.*, 2:33, 1996.
Pressprich, Maybury, Thomas, Linton, Irene, Murray, *J. Chem.*, 4:5568, 1989.
Rose, Patel, Lovell, Muir, Mann, *Chem. Commun,* 7:829, 1998.
Scott and Balkus, *Chem. Mater.*, 11:189, 1999.
Segal, Park, Suib, *Chem. Mater.*, 1,98, 1997.
Tolbert, Firouzi, Stucky, *Science*, 278:264, 1997.
Tsapatsis and Boudreau, *Chem. Mater.*, 9:1705, 1997.
Tsapatsis and Lovallo, *Chem Mater.*, 8:1579, 1996.
Tsapatsis, Okubo, Lovallo, Davis, *Mater. Res. Soc. Symp.*, 371:21, 1995.
Wang, Cheng, Jiang, Trirung, *J. Appl. Phys.*, 28:927, 1995.
Yan and Bein, *J. Am. Chem. Soc.*, 40:9990, 1995.
Yan, Chaudburi, Saricar, *Mater. Res. Soc. Symp. Proc.*, 431:211, 1996.

What is claimed is:

1. A method of coating a plurality of substrates, comprising:
   providing a target;
   ablating material from said target to create a plume;
   manipulating the plurality of substrates in said plume to simultaneously coat the entirety of said plurality of substrates with a film; and
   heating said film in a synthesis gel of said target.

2. The method of claim 1, wherein heating said film forms an oriented film.

3. The method of claim 2, wherein said oriented film comprises crystals normal to the surface of said substrates.

4. The method of claim 1, wherein said target comprises a zeolite.

5. The method of claim 4, wherein said zeolite comprises at least one of UTD-1, ZSM-5, Beta, Mordenite , NaX, NaA, SSZ-33, SSZ-31, SSZ-42, MCM-22, or a mixture thereof.

6. The method of claim 1, wherein said target comprises a phosphate.

7. The method of claim 6, wherein said phosphate comprises an aluminum phosphate.

8. The method of claim 7, wherein said aluminum phosphate comprises at least one of VPI-5, AlPO$_4$-5, AlPO$_4$-8, or a mixture thereof.

9. The method of claim 6, wherein said phosphate comprises a silicon aluminum phosphate.

10. The method of claim 9, wherein said silicon aluminum phosphate comprises at least one of SAPO-5, SAPO-37, SAPO-42, or a mixture thereof.

11. The method of claim 6, wherein said phosphate comprises a metal aluminum phosphate.

12. The method of claim 11, wherein said metal aluminum phosphate comprises at least one of MAPO-39, MAPO-5, MAPO-11, UCSB-6, UCSB-7, or a mixture thereof.

13. The method of claim 1, wherein said target comprises a mesoporous molecular sieve.

14. The method of claim 13, wherein said mesoporous molecular sieve comprises at least one of MCM-41, MCM-48, SBA-15, SBA-16, Nb-TMS-1, Ti-TMS-1, Ta-TMS-1, or a mixture thereof.

15. The method of claim 1, wherein said ablating comprises subjecting said target to pulsed radiation from an excimer laser.

16. The method of claim 15, wherein said laser comprises a KrF* laser operating between about 70 and about 200 mJ/pulse with a repetition rate between about 1 and about 50 Hz.

17. The method of claim 1, wherein manipulating comprises moving said plume relative to said substrates.

18. The method of claim 1, wherein said manipulating comprises vibrating said substrates.

19. The method of claim 1, wherein said heating comprises heating between about 1 hour and about 200 hours.

20. The method of claim 1, further comprising adjusting a background pressure of said substrates to between about 150 mTorr and about 350 mTorr.

21. The method of claim 20, wherein said background pressure comprises a background pressure of $O_2$.

22. The method of claim 1, wherein at least one of said substrates comprises a zeolite crystal, glass, metal, metal oxide, or plastic.

23. The method of claim 1, wherein at least one of said substrates comprises a porous substrate.

24. The method of claim 1, wherein a largest dimension of at least one of said substrates is between about 10 nm and about 10 mm.

25. The method of claim 1, wherein at least one of said substrates is spherical.

26. The method of claim 1, further comprising washing or calcining said oriented film.

27. A method of coating a plurality of substrates with an oriented film, comprising:
   providing a target comprising Cp*$_2$Co$^+$ or Cp$_2$Fe;
   laser ablating material from said target to create a plume;
   vibrating the plurality of substrates in said plume to simultaneously coat the entirety of said plurality of substrates with a film; and
   heating said film in a synthesis gel of said target to form the oriented film.

28. The method of claim 27, wherein said laser ablating comprises a first stage and a second stage, said first stage ablating material at a first laser power and said second stage ablating material at a second laser power, and wherein said first laser power differs from said second laser power.

29. A method of coating a plurality of substrates with an oriented film, comprising:
   providing a target comprising CP*$_2$Co$^+$ or Cp$_2$Fe;
   directing pulsed laser radiation having an energy between about 70 mJ/pulse and about 200 mJ/pulse at a repetition rate of between about 1 Hz and about 50 Hz to said target to create a plume;
   heating said plurality of substrates;
   maintaining a pressure between about 150 mTorr and about 350 mTorr about said plurality of substrates;
   vibrating said plurality of substrates within said plume to simultaneously coat the entirety of said plurality of substrates with a film; and
   heating said film in a synthesis gel of said target to form the oriented film.

30. The method of claim 29, further comprising washing or calcining said oriented film.

* * * * *